United States Patent [19]

Müeller

[11] Patent Number: 4,476,545

[45] Date of Patent: Oct. 9, 1984

[54] DYNAMIC SEMICONDUCTOR MEMORY CELL WITH RANDOM ACCESS AND METHOD FOR ITS PRODUCTION

[75] Inventor: Wolfgang Müeller, Putzbrunn, Fed. Rep. of Germany

[73] Assignee: Siemens Aktiengesellschaft, Berlin & Munich, Fed. Rep. of Germany

[21] Appl. No.: 315,358

[22] Filed: Oct. 27, 1981

[30] Foreign Application Priority Data

Nov. 24, 1980 [DE] Fed. Rep. of Germany ....... 3044132

[51] Int. Cl.³ .................... G11C 13/00; G11C 11/40
[52] U.S. Cl. .................................... 365/178; 365/174
[58] Field of Search ............... 365/178, 174, 230, 219; 357/52

[56] References Cited

PUBLICATIONS

S. Matsue et al., "A. 256 K-Dynamic RAM"; *ISSCC 80, Digest of Tech. Papers,* (Feb. 1980), pp. 232-233.
J. A. Appels et al., "Local Oxidation of Silicon; New Technological Aspects", *Philips Research Reports,* vol. 26, No. 3, (Jun. 1971), pp. 157-156.
S. A. Abbas et al., "Low-Leakage, N-Channel Silicon Gate FET with a Self-Aligned Field Shield", *IEEE Internat. Electron Devices Meeting, Tech. Digest,* (Washington, D.C., Dec. 1, 1973), pp. 371-373.
C. N. Ahlquist et al., "A 16 384-Bit Dynamic RAM", *IEEE J. of Solid-State Circuits,* vol. SC-11, No. 5, (Oct. 1976), pp. 570-573.

*Primary Examiner*—Terrell W. Fears

[57] ABSTRACT

A RAM memory cell in double polysilicon technology having improved packing density is attained by insulating neighboring active memory regions under a first polysilicon plane by ion implantation to increase the substrate doping of the surface of the semiconductor body whereby field shield insulation regions are generated by a transistor in the off-state and the memory regions are rendered self-conducting by the ion implantation so that with a voltage at the polysilicon-1-electrode of 0 volts, the full operating voltage can be written into the memory capacitor.

2 Claims, 9 Drawing Figures

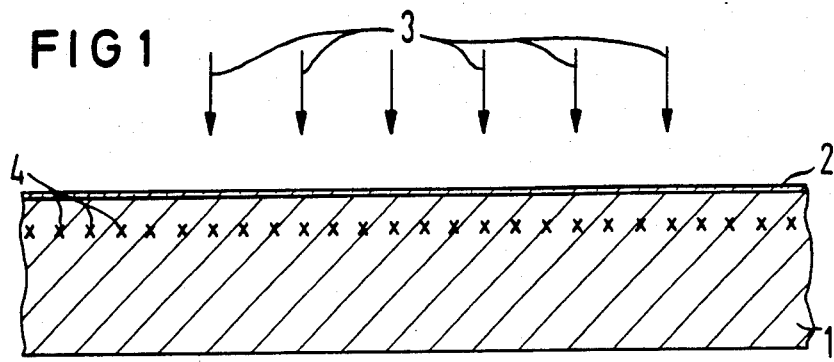
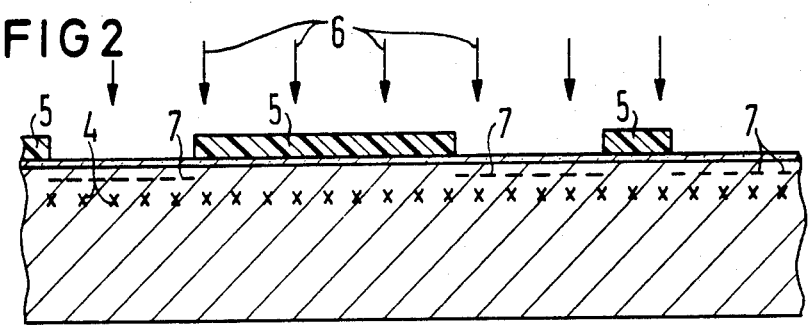
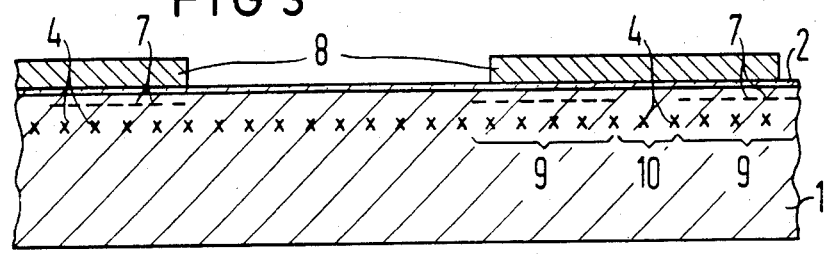
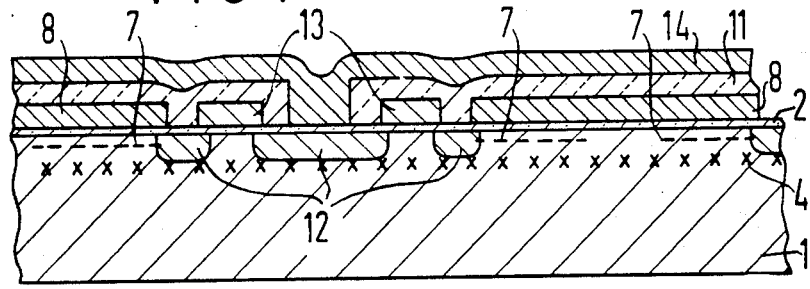

DYNAMIC SEMICONDUCTOR MEMORY CELL WITH RANDOM ACCESS AND METHOD FOR ITS PRODUCTION

BACKGROUND OF THE INVENTION

1. Field Of The Invention

The invention relates to dynamic semiconductor memory cells with random access (RAM=random access memory) and somewhat more particularly to such RAM memory cells which include a first polysilicon plane applied insulated on a semiconductor body as a memory electrode and a second polysilicon plane applied insulated from the first polysilicon plane as word lines and to a method of producing such memory cells.

2. Prior Art

The double polysilicon gate ($Si^2$-gate) process is generally considered as a standard process for attaining dynamic RAM memories. A typical $Si^2$-gate process for producing a dynamic 16 384 bit memory with random access is described in IEEE Journal of Solid State Circuits, Vol. Sc-11, (October 1976) pages 570-573.

With currently attainable structure resolution via photolithography of approximately 1.5 $\mu$m, as can be derived from the Conference Volume, ISSCC, Feb. 15, 1980, Digest of Technical Papers, pages 232-233, a 256 K-dynamic RAM memory cell has already been designed and assembled. Insulation between neighboring active regions (transistors, memory capacitors, diffused zones, etc.) is presently attained by thick oxide regions with so-called LOCOS technology. The LOCOS process (i.e. local oxidation of silicon) is an insulation technique for integrated circuits with high packing density. As insulating material between active transistor regions, silicon dioxide ($SiO_2$) is utilized. After selective deposition of an oxide and a nitride layer, a local oxidation takes place in the nitride-free zones, during which a strong lateral sub-oxidation (resulting in so-called bird beaks) and a strong laterally outward diffusion of field implantation takes place. As a result, the resulting device has a strong width dependence of the operating or cutoff voltage for narrow transistors. LOCOS techniques of this type are reported in Philips Research Reports, Vol. 26, No. 3, (June 1971) pages 157-165. With this type of insulation technique, because of the gradual transition between thick oxide and thin oxide regions (bird beaks) of approximately 0.5 $\mu$m in length, minimum structural dimensions cannot be attained for insulation spacing. The minimum insulation spacing of LOCOS insulation thus is about double the bird beaks length, over and above the minimum structural dimension. This results that, for example, in a case of a 256 K-RAM memory cell, known from the earlier referenced Conference Volume, ISSCC, 1980, an additional space requirement of approximately 25% of of cell area is required.

SUMMARY OF THE INVENTION

The invention allows the production of dynamic RAM memory cells with double polysilicon gate technology, with a reduction of area size required, simplification of the technological processes and an improvement of electrical properties, such as recovery times and width dependence of the cutoff or operating voltage, and thus provides an alternative technology to LOCOS insulation techniques.

In accordance with the principle of the invention, a dynamic semiconductor memory cell with random access of the type described earlier is produced by utilizing, for insulation of neighboring active memory regions in the semiconductor body, under a first polysilicon plane, by means of ion implantation, an increase of substrate doping on the semiconductor body surface whereby a field plate insulation region arises by means of a transistor in the off-state and by rendering the memory regions self-conducting by ion implantation so that with a voltage at the polysilicon-1 electrode of 0 volts, a complete operating voltage can be written into the memory capacitance. This socalled field-shield insulation is known from the Conference Volume, IEEE, International Electron Devices Meeting, Technical Digest (Washington D.C., December 1973) pages 371-373 for decreasing the leakage currents in n-channel silicon gate field effect transistors in silicon-aluminum technology. The field shield insulation can be employed very well in double silicon gate processes. In such processes, a first polysilicon plane (poly-1) operates in the memory region, both as a memory electrode (as in a customary double silicon gate RAM process) and additionally as a field shield electrode when two different regions are correspondingly doped. In the periphery, the polysilicon-1 plane functions only as a field shield electrode.

For implementing the inventive process for producing a dynamic semiconductor memory with random access (RAM), which is characterized in that for insulation of the individual active memory regions (after generation of the gate oxide and before the generation of the memory regions by a masked ion implantation), a whole-surface implantation with ions of a conductivity type opposite to those in the active memory regions, is carried out.

In an exemplary embodiment of the invention, a sequential combination of the following steps occurs:

(a) generating a thermal oxide layer, functioning as a gate oxide, on a p-doped silicon substrate;

(b) performing a whole-surface boron ion implantation for adjusting the cutoff or operating voltage on the insulation regions (enhanced implantation);

(c) performing a photosensitive resist technique for definition of the active memory regions;

(d) generating memory regions by means of an arsenic ion implantation (depletion implantation);

(e) removing the photosentive resist structures;

(f) depositing a first polysilicon plane and structuring a polysilicon-1 electrode;

(g) generating an insulation oxide;

(h) depositing a second polysilicon plane and structuring polysilicon-2-word lines;

(i) generating source/drain regions by means of arsenicion implantation;

(j) applying an intermediate oxide;

(k) performing contact hole etching to the source/drain regions;

(l) performing a whole-surface metallization and structuring of conductor paths; and (m) passivating the completed component.

As the above-described process cycle illustrates, the inventive process, with the field-shield insulation, provides, relative to the LOCOS process, a significant simplification of the technological steps. Thus, the steps for generating the thick oxide regions (nitride/oxide deposition, nitride deposition, nitride structuring through a first mask, field implantation, field oxidation, oxide/nitride etching, nitride removal, nitride-oxide oxidation and removal of nitride-oxide) drop out.

BRIEF DESCRIPTION OF THE DRAWING

FIGS. 1-4 are partial schematic sectional views of a semiconductor component undergoing essential steps in accordance with the principles of the invention;

DESCRIPTION OF PREFERRED EMBODIMENTS

Figure 5:
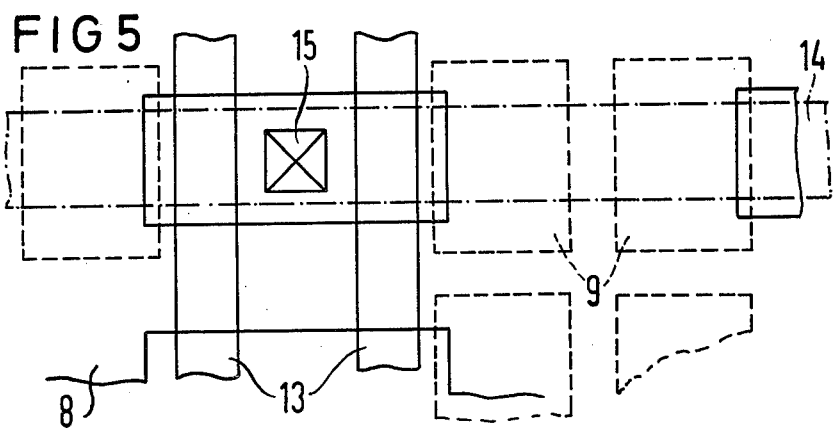
FIG. 5 is a schematic top layout view of a section of a memory region produced in accordance with the principles of the invention.

Throughout the drawings, similar parts are designated with the same reference numerals.

FIG. 1 illustrates a p-doped silicon substrate 1 (20 ohm.cm) having a thermal oxide layer 2 grown on the surface thereof in a layer thickness of about 25 nm. An implantation of boron ions (schematically illustrated with arrows 3) takes place through the oxide layer 2. Boron ions implanted in the silicon substrate 1 are designated 4. The borom implantation is performed for adjustment of the cutoff or operating voltage of the insulation regions, of approximately 1 V in a first implantation step with about $7\times10^{11}$ B cm$^{-2}$ and 25 keV and, in a second implantation step with about $1.5\times10^{11}$ B cm$^{-2}$ and 140 keV. However, a single implantation step can also be performed wherein the implantation dosage is adjusted to about $8\times10^{11}$ B cm$^{-2}$ at 60 keV.

In FIG. 2, with the aid of an implantation mask 5 comprised of a photosensitive resist, future memory regions (designated 9 in FIG. 3) are defined and thereafter an arsenic ion implantation (schematically illustrated by arrows 6) is performed. The arsenic implantation is adjusted for a cutoff or operating voltage of the memory region of 5 V whereby an implantation dosage of about $5\times10^{12}$ As cm$^{-2}$ at 80 keV is utilized. The arsenic ions implanted in the substrate are designated 7.

In FIG. 3, after removal of the resist mask 5, a polysilicon-1 plane is applied and structured by means of an anisotropic etching technique, preferably by reactive sputter-etching in an oxygen-Freon (a registered trademark for certain hologenated hydrocarbons, typically CF$_4$ or CHF$_3$) mixture, in such a manner that the polysilicon-1 electrodes 8 are formed. FIG. 3 illustrates, in the bracketed areas, memory regions 9 as well as the field-shield insulation regions 10 generated in substrate 1. With this arrangement, it is assured that when a voltage of 0 V is present at polysilicon-1-electrodes 8, both the field-shield regions 10 can be insulated and an available voltage thrust of V$_{DD}$ (operating voltage) of 5 V can be written into the cell.

The subsequent steps of the inventive process, similarly to the generation of insulation oxides, comprise depositing a second polysilicon plane and structuring of polysilicon-2-word lines, generation of source/drain regions by means of arsenic implantation, application of an intermediate oxide, formation of contact holes by etching to the source/drain regions, whole-surface metallization and structuring of conductor paths, as well as passivation of the completed component take place in accordance with known process steps. Detailed illustrations of such steps were dispensed with for sake of clarity.

FIG. 4 illustrates, in section, the structure at the end of the process. The intermediate oxide is designated 11, the source/drain regions are designated 12, the polysilicon-2-word lines are designated 13 and the metal conductor paths are designated 14.

FIG. 5 illustrates a top view of a section from a memory cell produced in accordance with the principles of the invention. The various parts are designated with the same reference numerals as in FIGS. 3 and 4. Reference numeral 15 designates a region of the contact hole to the source/drain regions.

Figure 6:
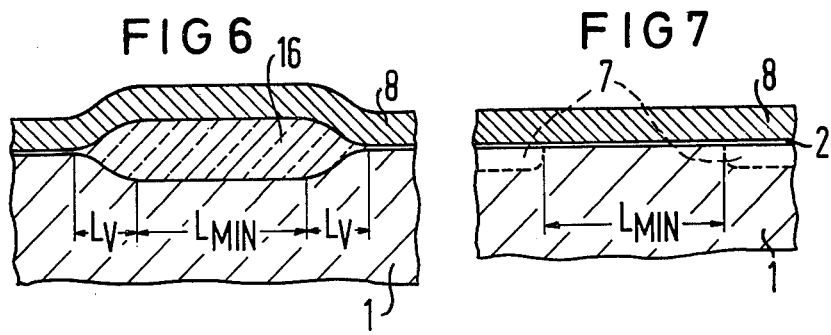
FIGS. 6-9 are partial schematic sectional views showing a comparison of a LOCOS insulation with field shield insulation for insulating two adjacent memory cells (FIGS. 6 and 7) and for insulation of polysilicon-2 gate regions and n+ diffused regions (FIGS. 8 and 9)
Figure 7:
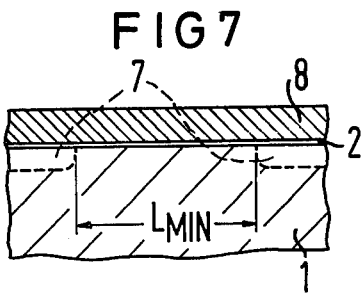

As can be seen from a comparison of FIGS. 6 and 7, the minimum insulation spacing for a field-shield insulation (FIG. 7) is determined by the minimum structural dimension, L$_{MIN}$, on the implantation mask. On the other hand, with LOCOS insulation (FIG. 6), the minimum insulation spacing is greater than the minimum structural dimension L$_{MIN}$, by double the bird beak length L$_V$. The region 16 designates the thick oxide, which is eliminated in the region of the memory cell according to FIG. 7.

Figure 8:
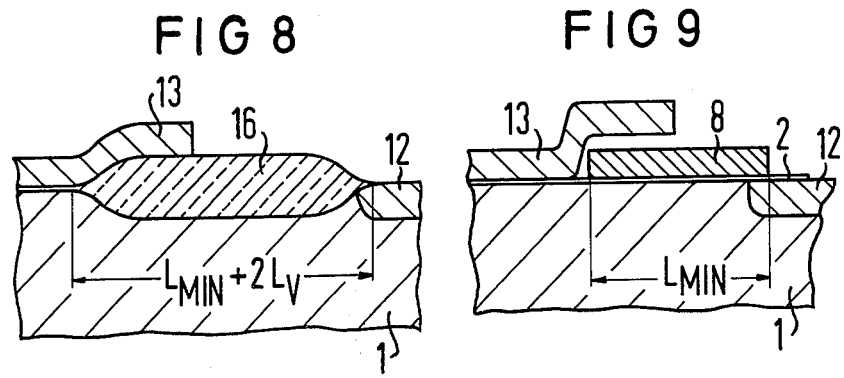
Figure 9:
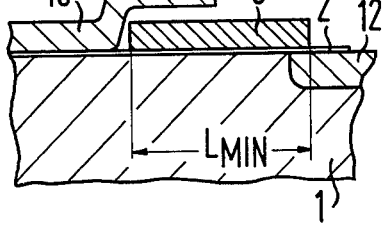

FIGS. 8 and 9 show a comparison of LOCOS insulation (FIG. 8) and field-shield insulation (FIG. 9) between polysilicon-2 gate region 13 and n+-diffused region 12. Because of the high precision in structural transfer during use of anisoltropic etching for structuring polysilicon-1 field-shield electrodes 8, as in the case of field-shield insulation, the minimal structural dimension L$_{MIN}$, can be obtained as insulating spacing.

In addition to a gain in packing density and saving of technological steps attained with field-shield insulation, an improvement of electrical properties is also achieved. Thus, at the thick oxide regions of a LOCOS insulation (such as region 16 of FIGS. 6 or 8) disruptions of the crystal structure lead to increased generation so that additional measures (getter steps) must be undertaken in order to guarantee a sufficiently long relaxation or recovery time of the memory state. The ideal planar structure of a field-shield insulation, as is shown in FIG. 7, allows one to achieve a significantly improved behavior.

A further improvement can be expected with respect to the width dependence of the cutoff voltage of the polysilicon-2 transistors (transfer gates). With LOCOS insulation, the width dependence of the polysilicon-2 transistors is determined, above all, by the lateral diffusion of the implantation field. However, with field-shield insulation (as in FIG. 9), the doping under a polysilicon-1 field-shield electrode and a polysilicon-2 gate electrode are the same, in instances of equal oxide thicknesses. Thus, the width dependence of the cutoff or operating voltage exhibits the best possible behavior.

The application of field-shield insulation is not limited to dynamic RAM memories. The improvements set forth for memory periphery with the use of the FIG. 9 arrangement can also be transferred to logic circuits.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, accepting as set forth and defined in the hereatoppended claims.

I claim as my invention:

1. In a dynamic semiconductor memory cell with random access (RAM) having a first polysilicon which is insulated from a semiconductor body by a dielectric layer as a memory electrode for memory regions generated in the semiconductor body and a second polysilicon plane applied insulated from the first polysilicon plane as word lines, the improvement comprising wherein:

the electric isolating regions between neighboring active memory cells in the semiconductor body, under the first polysilicon plane, are generated by implantation of ions to increase the substrate doping on the surface of said semiconductor body whereby field shield insulation regions are generated by a transistor in the offstate and the memory regions are rendered self-conducting by said implantation of ions so that with a voltage at the polysilicon-1-electrode of 0 volts, the full operating voltage can be written into the memory capacitance.

2. In a dynamic semiconductor memory cell having random access (RAM) as defined in claim 1, wherein said insulators of individual neighboring active memory regions comprise whole-surface implanted regions of ions of a conductivity type opposite to that in the active memory regions and are located between said active memory regions.

* * * * *